United States Patent [19]

Neckers et al.

[11] 4,315,998

[45] Feb. 16, 1982

[54] POLYMER-BOUND PHOTOSENSITIZING CATALYSTS

[75] Inventors: Douglas C. Neckers, Bowling Green, Ohio; Erich C. Blossey, Winter Park, Fla.; A. Paul Schaap, Detroit, Mich.

[73] Assignee: Research Corporation, New York, N.Y.

[21] Appl. No.: 9,713

[22] Filed: Feb. 5, 1979

Related U.S. Application Data

[63] Continuation of Ser. No. 699,746, Jun. 24, 1976, abandoned, which is a continuation-in-part of Ser. No. 478,694, Jun. 12, 1974, abandoned.

[51] Int. Cl.$^3$ .................... C08F 8/00; C08G 69/48
[52] U.S. Cl. .................... 525/332; 204/157.1 R; 204/158 R; 204/159.11; 204/159.14; 204/159.15; 204/159.16; 204/159.17; 204/159.23; 204/159.24; 525/326; 525/330; 525/329; 525/386; 525/420
[58] Field of Search .................... 204/159.11, 159.14, 204/159.15, 159.16, 159.17, 159.22, 159.23, 158 R, 157.1 R, 162 R, 159.24; 525/332, 329, 330, 326, 386, 420

[56] References Cited

U.S. PATENT DOCUMENTS

| | | | |
|---|---|---|---|
| 3,382,276 | 5/1968 | Schenck et al. | 204/158 R |
| 3,579,339 | 5/1971 | Chang et al. | 96/115 P |
| 3,632,493 | 1/1972 | Rogers | 204/159.14 |
| 3,641,217 | 2/1972 | Agolini | 525/332 |
| 3,723,271 | 3/1973 | Karl-Heinrich | 204/162 R |
| 3,730,734 | 5/1973 | Delzenne | 96/115 R |
| 3,794,626 | 2/1974 | Ulrich et al. | 96/115 P |
| 3,847,771 | 11/1974 | McGinniss | 204/159.24 |
| 3,912,697 | 10/1975 | Pacifici | 96/115 P |
| 3,915,824 | 10/1975 | McGinniss | 204/159.23 |
| 3,926,638 | 12/1975 | Rosen et al. | 96/115 R |
| 3,929,490 | 12/1975 | Reiter et al. | 96/115 P |
| 4,008,136 | 2/1977 | Williams | 204/158 R |

FOREIGN PATENT DOCUMENTS 959679  6/1964  United Kingdom ............... 526/258

OTHER PUBLICATIONS

Blossey et al. *J.A.C.S.*, vol. 95, pp. 5820-5822 (1973).

*Primary Examiner*—Harold D. Anderson
*Attorney, Agent, or Firm*—E. Janet Berry

[57] ABSTRACT

Polymer-bound photosensitizing catalysts are effective in the heterogeneous catalysis of various photosensitized chemical reactions, such as photooxidation reactions, photodimerization reactions, and photocycloaddition reactions, and are thereafter readily separated from the reaction medium and reaction products by simple filtration. The polymer-bound photosensitizing catalysts comprise the nucleophilic displacement reaction product of (A) a polymeric material having attached thereto an available leaving group which is capable of being displaced in a nucleophilic displacement reaction with a nucleophilic reagent and (B) a photosensitizing catalytic compound containing in its molecule a nucleophile which is capable of displacing the leaving group attached to the polymeric material in a nucleophilic displacement reaction.

8 Claims, No Drawings

POLYMER-BOUND PHOTOSENSITIZING CATALYSTS

The work leading to the present invention was supported in part by a grant from the Department of Health, Education and Welfare, and in part by a grant from the National Science Foundation, and the invention herein was made in the course or under a grant thereunder with the Department of the Army (Grant DA-ARO-D-31-124-73-617).

This application is a continuation application of copending application Ser. No. 699,746, filed June 24, 1976 now abandoned, entitled "Polymer-Bound Photosensitizing Catalysts and Photosensitized Reactions Utilizing Same" which in turn is a continuation-in-part application of application Ser. No. 478,694, filed June 12, 1974, entitled "Polymer-Bound Photosensitizing Catalyst and Photosensitized Reactions Utilizing Same", and now abandoned.

The present invention relates to photosensitizing catalysts and to photosensitized chemical reactions utilizing the same. More particularly, the invention relates to such catalysts which are chemically bound to a polymeric material and which are useful in the heterogeneous catalysis of photosensitized reactions such as photooxidation, photodimeriztion and photocycloaddition reactions.

Numerous chemical reactions are known in the art which are catalyzed by light in the presence of a photosensitizing catalyst. For example, one type of photosensitized chemical reaction which has attained increased significance in recent years in the syntheses of many commercially important organic compounds is the photooxidation of various organic substrate materials by means of singlet oxygen. In these reactions, the free activated singlet oxygen is generated from molecular oxygen in the paramagnetic ground state by energy transfer from light and a photosensitizing catalyst. The photosensitizing catalysts which up to now have primarily been employed in these type of reactions are various photosensitizer dyes, such as rose bengal, methylene blue, eosin, chlorophyll, fluorescein, acridine orange, porphyrins, and the like.

The dyes which previously have been employed as photosensitizing catalysts have been found to possess several disadvantages. First of all, the catalyzing effectiveness of such dyes is generally operative only in homogeneous catalysis systems, i.e., where the dyes are soluble in the reaction medium. In heterogeneous catalysis systems where the reaction medium is such that the dyes are insoluble therein, the dyes have generally been found ineffective as photosensitizing catalysts. This limitation poses the problem of subsequently separating the soluble photosensitizing catalyst from the photooxidation products, which is often very difficult, and also places restrictions on the type of reaction medium that can be employed since most of the photosensitizer dyes used are not readily soluble in many of the common organic solvents. Moreover, the effective concentration of photosensitizer dyes which can be employed is limited not only due to the increased difficulty of separating higher concentrations of photosensitizer dye from the photooxidation products, but also due to the fact that at higher concentrations the photosensitizer dyes tend to form dimers and higher aggregates which reduce their effectiveness as photosensitizers.

It is therefore a primary object of the present invention to provide a photosensitizing catalyst which is effective in the heterogeneous catalysis of photosensitized chemical reactions.

Another object of the invention is to provide a photosensitizing catalyst which may be readily separated from the reaction medium of photosensitized chemical reactions and subsequently reused.

A further object of the invention is to provide a photosensitizing catalyst which can be effectively employed in catalyzing photosensitized chemical reactions in a wide variety of reaction media.

Still another object of the invention is to provide a photosensitizing catalyst which can be used in relatively large effective concentrations in catalyzing photosensitized chemical reactions without contaminating the reaction product and without forming dimers or higher aggregates of the catalyst which would reduce its effectiveness as a photosensitizer.

Still a further object of the invention is to provide a photosensitizing catalyst having all of the characteristics described in the preceding objects and which is particularly effective in conjunction with a source of light in sensitizing the generation of singlet oxygen from molecular oxygen in its paramagnetic ground state in photooxidation reactions.

The above and other objects are achieved in accordance with the present invention by providing a polymer-bound photosensitizing catalyst comprising the nucleophilic displacement reaction product of (A) a polymeric material having attached thereto an available leaving group which is capable of being displaced in a nucleophilic displacement reaction with a nucleophilic reagent and (B) a photosensitizing catalytic compound containing in its molecule a nucleophile which is capable of displacing the leaving troup attached to the polymeric material in a nucleophilic displacement reaction.

It is to be understood that, as used herein in the specification and claims, the term "nucleophilic displacement reaction" is limited in its context to reactions in which a group or atom having an unshared pair of electrons becomes attached to a carbon atom, at the same time displacing a group or atom which leaves with its pair of binding electrons. In such reactions, the group or atom which is displaced is termed the "leaving group", while the group or atom which becomes attached to the carbon atom is termed the "nucleophile". The term "nucleophilic reagent" is used to denote any compound containing in its molecule an available nucleophile which is capable of displacing a leaving group in a given base compound by means of a nucleophilic displacement reaction.

It has been found that the polymer-bound photosensitizing catalysts of the present invention can be employed, in conjunction with a source of light, in the heterogeneous catalysis of various photosensitized chemical reactions in a wide variety of reaction media, can be readily separated from the reaction medium by filtration and subsequently reused, and can be employed in relatively high effective concentrations without contaminating the reaction product and without forming dimers or higher aggregates of the catalyst which would reduce its effectiveness as a photosensitizer. It has furthermore been found that certain of the polymer-bound photosensitizing catalysts of the present invention are particularly effective, in conjunction with a source of light, in sensitizing the generation of singlet oxygen from molecular oxygen in its paramagnetic ground state in photooxidation reactions.

The polymeric material which serves as the base or support for the polymer-bound photosensitizing catalyst in the present invention, may be any polymeric material having attached thereto an available leaving group which is capable of being displaced in a nucleophilic displacement reaction with a nucleophilic reagent. The preferred polymeric material is a styrene polymer, such as polystyrene or a copolymer of styrene with, for example, divinylbenzene or an alkyl acrylate, which has been activated by chloromethylation. For example, polystyrene, either in the form of beads or as a thin film, can be activated for the purposes of the present invention by reaction with chloromethyl methyl ether by the reaction shown below:

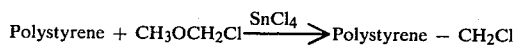

In the resulting chloromethylated polystryene, the chloride ion is an available leaving group which is capable of being displaced in a nucleophilic displacement reaction with a nucleophilic reagent. Various other polymeric materials, such as, for example, polyvinylidene chloride, can be used in place of the chloromethylated styrene polymers, so long as it has attached thereto an available leaving group which is capable of being displaced in a nucleophilic displacement reaction with a nucleophilic reagent.

A wide variety of compounds having photosensitizing properties can be chemically bound to the polymer supports described above in preparing the heterogeneous photosensitizing catalysts of the present invention, the critical feature of such compounds being that they contain in their molecule a nucleophile which is capable of displacing the leaving group attached to the polymeric material in a nucleophilic displcement reaction. The nucleophile may be any of a wide variety of groups or atoms having an unshared pair of electrons including, for example, the carboxylate group, the amino group, the alkylamino group, the dialkylamino group, the phosphate group, the nitro group, various metal atoms, and the like. Examples of compounds having photosensitizing properties and containing in their molecules at least one of the above nucleophiles include carbonyl photosensitizers, such as para-benzoyl benzoic acid, and photosensitizer dyes, such as rose bengal, acridine orange, chlorophyllin, crystal violet, eosin Y, fluorescein, flavin mononucleotide, hematoporphyrin, hemin, malachite green, methylene blue, rhodamine B, chlorophyll, cosine, erythrosin, methylene green, toluidine blue and thionine.

To prepare the polymer-bound photosensitizing catalysts of the present invention, the polymeric support, as described above, and the photosensitizing catalytic compound as described above, are reacted together by means of a nucleophilic displacement reaction so that the nucleophile in the molecule of the photosensitizing catalytic compound displaces the leaving group which is attached to the polymeric support, whereby the photosensitizing catalytic compound becomes chemically bound to the polymeric support. The reaction is preferably carried out in an inert organic solvent and although the reaction may be carried out at any temperature between the freezing point and boiling point of the solvent it is preferably carried out at reflux. By way of illustration, where the polymeric support is chloromethylated polystyrene and the photosensitizing catalytic compound contains in its molecule the carboxylate anion as the nucleophile, as in the case of the photosensitizer dye rose bengal, the reaction proceeds as follows:

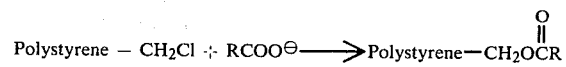

A number of both physical and chemical properties of the polymers have been determined. Since a large number of the polymers are crosslinked, they are insoluble in all the usual solvents. It is accordingly impossible to carry out molecular weight determinations by the known methods. However, spectroscopic evidence (both infrared spectroscopy ultraviolet and visible diffuse reflectance spectroscopy) has been obtained which shows that the sensitizers are attached to the polymer. In some instances, chemical evidence has been obtained whereby there has been cleavage of the bound sensitizers from the polymer followed by identification of the cleaved sensitizer.

The polymer-bound photosensitizing catalysts of the present invention are insoluble in water and all of the common organic solvents, and are effective in the heterogeneous catalysis of a wide variety of photosensitized chemical reactions, including for example, photooxidation reactions, photocycloaddition reactions, and photodimerization reactions. Substantially any photosensitized chemical reaction that can be carried out with the previously known soluble photosensitizers by homogeneous catalysis can be effected with the insoluble polymer-bound photosensitizing catalyst of the present invention by heterogeneous catalysis, the most significant advantage of the latter, particularly from a commercial standpoint, being the ease of separating the photosensitizer from the reaction medium and the reaction products after the reaction by simple filtration, thereby overcoming the separation difficulties generally encountered with the previously employed soluble photosensitizers.

The particular photosensitizing catalytic compound which is bound to the polymer support in carrying out any given photosensitized chemical reaction in accordance with the present invention, will depend largely upon the nature of the particular photosensitized chemical reaction being conducted. For example, polymer-bound carbonyl compounds, such as para-benzoyl benzoic acid bound to a polymer support, are effective in photosensitizing photodimerization reactions, such as the photodimerization of coumarin and the photodimerization of indene, and in photocycloaddition reactions, such as the photocycloaddition of tetrachloroethylene to cyclopentadiene. The polymer-bound photosensitizer dyes, on the other hand, are particularly effective in sensitizing photooxidation reactions wherein a photooxidizable substrate is oxidized by reaction with singlet oxygen generated from molecular oxygen in its paramagnetic ground state by energy transfer from light and the photosensitizing catalyst. Numerous organic compound substrates which are photooxidizable by reaction with singlet oxygen in this manner are well known in the art, and the photosensitizing activity of the polymer-bound photosensitizer dyes of the present invention can be used to advantage in the photooxidation of any of the these substances. Representative photooxidizable substrates are, for example, such open chain (aliphatic) and cyclic mono-olefins as 1-heptene, 1-octene, 1-dodecene, 1-hexadecene, diisobutylene, 2-methyl-2-butene, tetramethylethylene, cyclopentene, 1-methyl-1-cyclopentene, cyclohexane, 1-methylcyclohexene, 1,2-dimethylcyclohexene, cyclooctene, alpha-pinene, dipentene, limonene, carvomethene, terpinolene, propylene trimers, tetramers, pentamers, and the like, all of which are photooxidized to allylic hydroperoxides which can readily be reduced to alcohols or used in other ways as organic intermediates for the production of useful compounds. Other photooxidizable substrates include cyclic conjugated dienes, which are photooxidized to endocyclic peroxides, and open chain conjungated dienes, which are photooxidized to exocyclic peroxides. Representative of such dienes are, for example, cyclopentadiene, 1,3-cyclohexadiene, 2-methyl-1,3-cyclohexadiene, alphaterpinene, alpha-phellandrene, alpha-pyronene, beta-pyronene, 1,3-hexadiene 1,3-dimethylbutadiene, 2,3-dimethylbutadiene, alloocimene, and the like. Still further photooxidizable substrates whose photooxidation can be sensitized by the polymer-bound photosensitizing catalyst of the present invention include for example, heterocyclic olefins, for example, furans, 1,2-diphenyl-p-dioxene, and dihydropyran, which are photooxidized by 1,2-cycloaddition to 1,2-dioxetanes which cleave thermally to carbonyl-containing compounds; amines, thioureas, for example, thiourea; dienes of the sterol series, for example, ergosterol; triolefins; olefinic acids, for example, oleic acids; fulvenes, for example, phenylfulvene,; aldehydes; phenylhydrazones; semicarbazones, thiosemicarbazones, enol ethers, sulfinic acids, and the like. Such groups as ester, amide, urethane, n-acetyl, phenyl, hydroxyl, chloride, bromide, etc., even if adjacent to the oxidizable group in the foregoing types of substrates, do not ordinarily interfere in the photooxidization reaction.

It will be appreciated, of course, that the foregoing photooxidizable substrates will vary in their ease of photooxidation, photooxidiation rates, etc., and in the products resulting from photooxidation; such variations, however, do not affect the photosensitizing activity of the polymer-bound photosensitizer dye catalyst in the photooxidiation reactions. In each case, such catalyst, in conjunction with a source of light, will be effective in sensitizing the generation of singlet oxygen from molecular oxygen in its paramagnetic ground state for reaction with the photooxidizable substrate so as to introduce oxygen into the molecule of the photooxidizable substrate.

The irradiating light which is used in conjunction with the polymer-bound photosensitizing catalysts in the photosensitized chemical reactions in accordance with the present invention, can vary considerably in wave length, wave lengths in the visible regions being preferred. The light can be monochromatic or polychromatic, and can be furnished by any suitable source, such as fluorescent, tungsten-halogen or mercury lamps. Light of wave length in the range of about 3600 to about 8000 Angstroms has been found very suitable. The reaction time will be shortened as the intensity of the light source is increased.

The amount of the polymer-bound photosensitizing catalyst employed in the reaction can vary widely, but ordinarily only small catalytic amounts will be used. For example, amounts of polymer-bound photosensitizing catalyst sufficient to provide on the order of about 0.1 percent by weight of the photosensitizing catalytic compound moiety based on the weight of the substrate material are generally satisfactory. Various other amounts of the catalyst, for example, to provide from about 0.0001 percent up to about 1 percent or more by weight of the photosensitizing catalytic compound moiety based on the weight of the substrate material can be used.

In general, the experimental set-up for photooxygenation with polymer-bound rose bengal photosensitizer beads, for example involves dissolving the substrate in a solvent that will swell the polymer, like benzene, chloroform, or methylene chloride. Relatively small amounts of the polymer-sensitizer is needed for reaction. Air is then bubbled into the reaction flask and one or two 100 watt light bulbs (tungsten) are used as the light source. Reaction times varies as to the nature of the substrate. At the conclusion of the reaction the polymer-sensitizer is removed by filtration which is a tremendous improvement over ordinary sensitizer reactions.

In carrying out the photosensitized chemical reactions with the polymer-bound heterogeneous photosensitizing catalysts of the present invention, a wide variety of reaction media can be employed. Generally, the substrate material will be dissolved in an inert solvent which swells the polymer-bound catalyst. Depending upon the particular substrate material and its solubility, any of a wide variety of common solvents can be employed, including, for example, water, methylene chloride, carbon disulfide, chloroform, tetrahydrofuran, p-dioxane, and various hydrocarbon solvents such as benzene and toluene. The reaction may be carried out at any temperature between the freezing point and the boiling point of the solvent, and is preferably carried out at temperatures around room temperature, for example, from about 20 degrees to about 30 degrees C. At the conclusion of the reaction, the polymer-bound photosensitizing catalyst may be removed from the reaction medium and the reaction products by simple filtration.

In the case of the photooxidation reactions carried out in accordance with the present invention, the rate of oxygen addition during the photooxidation can vary greatly, although it may affect the time required to complete the reaction. Generally, the addition rate will be at least sufficient to provide all the oxygen which can be absorbed and utilized at a given time. Various types of agitators, mixers, and gas-liquid contact apparatus and procedures can be utilized to promote rapid absorption of oxygen by the substrate, thereby insuring a sufficiently high effective oxygen concentration. The concentration of oxygen can also be increased by use of pressure. Oxygen gas can be utilized as such, or it can be provided in the form of air or other oxygen-containing gaseous mixtures.

The following examples are given as illustrative of certain embodiments of the invention.

All melting points and boiling points are uncorrected. Infrared spectra were run on Perkin Elmer 700, and 337 spectrophotometers. Ultraviolet and visible spectra data were obtained on a Cary 14 and NMR spectra on Varian A-60 and EM-360 spectrometers. Analytical vpc was performed on a Hewlett-Packard 5750 Research Gas chromatograph operating in the flame ionization mode.

Diffuse internal reflectance spectra were measured on a Cary 15 Spectrophotometer with an internal reflectance attachment. Magnesium oxide was used as the suspending agent and concentrations were approximately 0.002 mol of reflecting entity per mole of MgO. The data in FIG. 1 are the reflectance spectra of solid Rose Bengal and of polymer-based Rose Bengal under identical conditions.

Chloromethylated styrene-divinylbenzene copolymer beads were obtained from commercial sources. The following alkenes were used as reactants as examples of the invention; 2,3-diphenyl-p-dioxene, 1,3-cyclohexadiene, tetramethylethylene, and 1,2-dimethylcyclohexane.

EXAMPLE 1

2.0 grams of rose bengal (2.1 mmol) was stirred at reflux in 60 ml of reagent grade dimethylformamide with 2.0 grams of chloromethylated styrene-divinylbenzene copolymer beads (1.38 meq-$CH_2Cl$, 50–100 mesh). After 20 hours, the polymer, which had become dark red, as filtered and washed successively with 150 ml portions of benzene, ethanol, ethanol-water (1:1), water, methanol-water (1:1), and methanol. After these washings, the final filtrate was colorless. The resulting polymer beads, consisting of rose bengal chemically bound to the styrene-divinylbenzene copolymer support apparently as the carboxylate ester, were dried in a vacuum oven to a final weight of 2.17 grams.

EXAMPLES 2–12

Following the procedure described in Example 1, above, various other photosensitizer dyes were substituted for the rose bengal and chemically bound to the chloromethylated styrene-divinylbenzene copolymer beads. The photosensitizer dyes which were bound to the polymer support in this manner were acridine orange, chlorophyllin, crystal violet, eosine Y, fluorescein, flavin mononucleotide, hematoporphyrin, hemin, malachite green, methylene blue and rhodamine B as well as the aforedescribed rose bengal.

In these experiments there was prepared the following additional sensitizers attached to polystyrene as the polymer:
Polymer-acridine orange
Polymer-chlorophyllin
Polymer-crystal violet
Polymer-eosin Y
Polymer-fluorescein
Polymer-flavin mononucleotide
Polymer-hematoporphyrin
Polymer-hemin
Polymer-malachite green
Polymer-methylene blue
Polymer-rhodamine B
Polymer-rose bengal As with the preparation of polymer rose bengal, the new polymer-bond sensitizers are attached to insoluble crosslinked polystyrene beads. Various types of polystyrene beads (i.e. variations in mesh size, degree of crosslinking, and amount of initial chloromethyl groups present in the polystyrene) were used.

| Compound | M.W. | $\lambda_{MAX}$ | $E_T$ | $E_S$ | Ⓘ $_{ic}$ | Ⓟ | —$CH_2Cl$ | Wt. | EB# |
|---|---|---|---|---|---|---|---|---|---|
| Acridine Orange | 267.37 | | 49.2 | 56.0 | | | 3 | 1.9 | 285 |
| Chlorophyllin | | | | | | | 3 | 1.9 | 286 |
| Crystal violet | 407.99 | | 38.9 | | | | 3 | 1.0 | 282 |
| Eosin Y | 691.91 | | 43.0 | | 0.71 | | 2 | 3.0 | 275 |
| Fluorescein | 376.27 | 493 W | 47.2 | 55.0 | 0.05 | | 3 | 2.0 | 276 |
| Flavin mononucleotide (Riboflavin phosphate) | 514.37 | 220,266 444,475 | | | | | 2 | 2.1 | 287 |
| Hematoporphyrin | 598.68 | 615 565 534 500 O,IN KOH | | | | | 2 | 2.5 | 288 |
| Hemin | 651.97 | | | | | | 2 | | 289 |
| Malachite Green | 354.90 | 616W | | | | | 3 | 1.2 | 279 |
| Methylene Blue | 373.90 | 609.688 | | | | | 3 | 2.0 | 295 |
| Rhodamine B | 497.0 | | 43.3 | 49.3 | 0.97 | | 2 | 3.0 | 308 |
| Rose Bengal | 973.72 | | | | | | 1 | 2.2 | 233 |
| | | | | | | | 2 | 5.0 | 260 |
| | | | | | | | 4 | 10.0 | 307 | a. Polymer used
1-50–100 mesh, 1.8% crosslinked polystyrene, 1.38 meq Cl/g
2-200–400 mesh, 1% crosslinked polystyrene, 1.11 meq Cl/g
3-200–400 mesh, 2% crosslinked polystyrene, 3.8 meq Cl/g
4-200–400 mesh, 1% crosslinked polystyrene, 0.69 meq Cl/g

EXAMPLE 13

Studies of various other polymers as bases for polymer rose bengal sensitizers have been made. Although the mode of preparation of the polymer based reagents was developed in each of the several cases, every rose bengal based polymer which was prepared and was found to be chemically stable was also a useful polymer based rose bengal sensitizer. Prior to the preparation of crosslinked (poly(2-hydroxyethyl)methacrylate-5% ethylene glycol) polymer based rose bengal, 2.0 grams of the polymer having a molecular weight exclusion limit of 40,000 and a nominal pore size of 45 angstrom, was treated with an excess of a 1 molar solution of HCl for 45 minutes at 55°, then the 2.0 grams of polymer was filtered from the HCl solution and added to 60 ml of methanol which contained 1.55 m mol of rose bengal. The mixture was stirred and heated at 60° for 24 hours, after which it was cooled to room temperature and filtered. The polymer was washed thoroughly with 300 ml of water and 100 ml of methanol. After drying, the polymer was extracted with methanol in a Soxhlet extractor for seven days or until all the color in the methanol solvent disappeared. The polymer was then dried in a vacuum oven at 65° for 24 hours before being used as catalyst in the oxidation procedure.

EXAMPLE 14

Crosslinked (poly(2-hydroxethyl)methacrylate-60% ethylene glycol) polymer having a molecular weight exclusion limit of 500,000 and a nominal pore size of 165 angstrom, was treated with rose bengal in a similar way as described in Example 13 but a reaction time of 5 days and ethanol as solvent was required.

EXAMPLE 15

As an alternative procedure, the polymer of Example 14 was suspended in 120 ml of water and was allowed to swell for 12 hours. 80 ml of freshly prepared cyanogen bromide solution (conc. 25 mg cyanogen bromide/ml) was added to the suspension. After addition of 10 ml of 1 N NaOH, the suspension was stirred at room temperature for six minutes. The activated gel was washed with 0.1 N sodium carbonate solution in water than washed with methanol and filtered. To the polymer was added 1.55 m mol rose bengal and 60 ml ethanol and the procedure above-described in Example 13 followed to obtain the polymer based rose bengal.

EXAMPLE 16

To 2.0 g of polyvinyl formal in 60 ml of methanol was added 1.55 m mol of rose bengal. The mixture was stirred and heated for 60° for 24 hours then cooled to room temperature and filtered. The residue was washed with 300 ml of water and 200 ml of methanol. The polymer complex was then extracted with methanol with a Soxhlet extractor for 120 hours until no visible color appeared in the solvent. The complex then was dried in a vacuum oven at 60° for 24 hours.

EXAMPLE 17

To 2.0 grams of activated glass of bromomethylated borosilicate glass, bead size (550-Å) and 60 ml of methanol was added 1.55 m mol of rose bengal. The mixture was stirred and heated at 60° for 24 hours then cooled to room temperature and filtered. The residue was used with 300 ml of water and 200 ml of methanol. The polymer complex was then extracted for 5 days and dried in a vacuum oven at 65° for 24 hours.

EXAMPLE 18

1.58 g (about 1.55 m mol) of rose bengal was added to 2.0 g of styrene-maleic anhydride copolymer in 60 ml of benzene. The copolymer has a 1000 A° bead size, an acid number of 473 mg KOH per gram, a kinematic viscosity at 30° C. of 0.70, a non-volatile content of 99 weight percent, and a Gardner color, hydrolyzed at 20% solids of 1+. The mixture was stirred and heated at 60° for 24 hours then cooled to room temperature and filtered. After washing thoroughly with a large excess of benzene, the polymer was extracted for 24 hours in a Soxhlet extractor. At this time, no visible color appeared in the solvent. The polymer was then dried in a vacuum oven at 65° for 24 hours and reached a constant weight of 3.05 g.

A second example of styrene-maleic anhydride copolymer was also reacted with rose bengal by the same procedure and gave similarly good results.

In this instance, the copolymer bead size of 2000 A°, an acid number of 344 mg. KOH per gram; a kinematic viscosity at 30° C. of 0.74, a non-volatile content of 97.7 weight percent, and a Gardner color, hydrolyzed at 20% content of 1+.

EXAMPLE 19

Small pieces of cotton were treated with water at 100° C. The cotton was heated with stirring at 50° C. for 20 minutes in a solution of 18.6% $CaCl_2$ in 18.6% water in methanol. After washing with 300 ml of water, the cotton was partially hydrolyzed with 3.65 M HCl at 45° C. for 40 minutes and washed with 300 ml of water and 100 ml of methanol.

To approximately 1 g of the thus pretreated cotton in 60 ml of methanol was added 1.55 m mol of rose bengal. The reaction was stirred and heated at 60° C. for 24 hours. The reaction mixture was then cooled to room temperature and filtered. The residue was washed with 250 ml of methanol and then extracted with methanol in a Soxhlet extractor for 3 days. The complex was then dried in a vacuum oven for 24 hours.

EXAMPLE 20

A fine thread of wool felt was treated with water at 100° C. The wool was heated with stirring at 50° C. for 20 minutes in a solution of 18.6% $CaCl_2$ in 18.6% water in methanol. The wool was, after washing with 300 ml of water, partially hydrolyzed on the inside surface with 3.65 M-HCl at 45° C. for 40 minutes. Then the wool was washed with 300 ml of water and 100 ml of methanol.

To approximately 1 g of the thus pretreated wool in 60 ml of methanol was added 1.55 m mole of rose bengal. The mixture was stirred and heated at 60° C. for 24 hours. The reaction mixture was then cooled to room temperature and filtered. The residue was washed with 250 ml of methanol and extracted with methanol in a Soxhlet extractor for 240 hours (no visible color). The complex was then dried in a vacuum oven for 72 hours.

EXAMPLE 21

A solution of sebacoyl chloride in 100 ml of carbon disulfide was placed in a 200 ml beaker. Over the acid chloride solution was carefully poured a solution of 4.4 g hexamethylene diamine in 50 ml water. The polymeric film which formed at the interface of the beaker as a continuously forming rope (ca. 1 mm in diameter) was wound up continuously with a glass bar until one of the reactant was exhausted.

The polymer obtained was washed five times with 50% of aqueous methanol solution. The nylon rope was cut to small pieces and then washed by dil. HCl (0.1 N) followed by water washing. It was then dried in a vacuum oven at room temperature for 24 hours.

The nylon was pretreated with 18.6% $CalCl_2$ in 18.6% water in methanol at 50° C. for 30 minutes. The nylon, which was removed by this treatment, was then washed with 250 ml of water and 100 ml of methanol. The pretreated nylon was partially hydrolyzed on the inside surface by stirring with 3.65 N-HCl at 40° C. for 40 minutes. The nylon was then washed with 250 ml of water and 200 ml of methanol.

To approximately 2 g of the nylon thus obtained in 60 ml of methanol was added 1.55 m mol of rose bengal. The mixture was stirred and heated at 60° C. for 48 hours. The reaction mixture was then cooled to ice-water temperature and filtered. The residue was washed thoroughly with 200 ml of methanol. The polymer complex was then extracted with methanol in a Soxhlet extractor for 48 hours until no visible color appeared in the solvent. Then nylon-rose bengal was then dried in a vacuum oven.

EXAMPLE 22

To a solution of 140 mg (0.6 mmol) of 1,2-diphenyl-p-dioxene having the formula

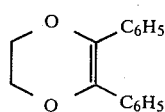

in 6 ml of methylene chloride was added 200 mg of the polymer-bound rose bengal photosensitizer beads as prepared in Example 1. The resultant mixture contained in a pyrex vessel was vigorously stirred at 10 degrees C. under oxygen and irradiated with a 500-watt tungsten-halogen lamp through a uv-cutoff filter. Gas chromatography indicated complete oxidation of the 1,2-diphenyl-p-dioxene after 6 hours. Removal of the photosensitizer beads by filtration of the reaction mixture through a sintered glass disc and removal of the solvent under vacuum gave colorless crystals in 95 percent yield of the carbonyl-containing compound having the formula

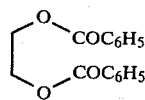

Absorption spectra of the reaction solution before and after photolysis indicated that no rose bengal or other sensitizer was leached into the reaction solution. Moreover, the dried photosensitizer beads removed from the reaction mixture were found to be reusable with no detectable decrease in efficiency.

The above-described oxidation conversion was shown to be a singlet oxygen-mediated reaction, as opposed to a free radical mechanism, by control experiments which indicated that the reaction was inhibited by the addition of 10 mol percent (based on the 1,2-diphenyl-p-dioxene) of 1-4-diazabicyclo[2.2.2]octane, a singlet oxygen quencher, and that the reaction could be carried out in the presence of 10 mol percent (based on the 1,2-diphenyl-p-dioxene) of 2,6-di-t-butylcresol, a free radical inhibitor.

The above-described reaction was also effected by photo-oxidation under similar conditions with 562 nm radiation using a Bausch and Lomb grating monochromator and SP-200 mercury light source. It was also found that a suspension in methylene chloride of solid rose bengal, without any polymer support, was ineffective in photosensitizing the generation of singlet oxygen.

EXAMPLE 23

The photooxidation procedure as described in Example 22, was repeated, substituting 1,3-cyclohexadiene for the 1,2-diphenyl-p-dioxide. The 1,3-cyclohexadiene was found to undergo photo-oxidation by a 1,4-cycloaddition reaction with the singlet oxygen produced by the polymer-bound rose bengal photosensitizer to form in 69 percent yield the cyclic peroxide having the formula

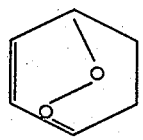

which was isolated by distillation under vacuum and compared to an authentic sample of such cyclic peroxide.

EXAMPLE 24

The photooxidation procedure described in Example 22, was repeated substituting tetramethylethylene for the 1,2-diphenyl-p-dioxene. The tetramethylethylene was found to undergo photo-oxidation by an "ene" type reaction with the singlet oxygen produced by the polymer-bound rose-bengal photosensitizer to form in 82 percent yield the allylic hydroperoxide have the formula

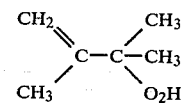

which was isolated by distillation under vacuum and compared to an authentic sample of such allylic hydroperoxide.

EXAMPLE 25

The photooxidation procedure described in Example 22, was repeated, substituting 1,2-dimethylcyclohexene for the 1,2-diphenyl-p-dioxene. The 1,2-dimethylcyclohexene was found to undergo photooxidation by an "ene" type reaction with the singlet oxygen produced by the polymer-bound rose bengal photosensitizer to form a product mixture containing 87 percent of the allyic hydroperoxide having the formula

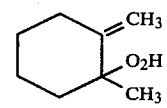

and 13 percent of the allylic hydroperoxide having the formula

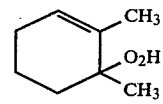

This is similar to the product distribution obtained by photo-oxidizing 1,2-dimethylcyclohexene with various known soluble sensitizers of singlet oxygen photooxidation.

EXAMPLE 26

The photooxidation procedure described in Example 22, was repeated, substituting dihydropyran for the 1,2-diphenyl-p-dioxene. The photooxidation of dihydropyran was found to yield a mixture of two products, one product, comprising 73 percent of the reaction product mixture, being obtained by thermal cleavage of a 1,2-dioxetane intermediate and having the formula

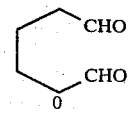

and the other product, comprising 27 percent of the reaction product mixture, being formed upon dehydration of an allylic hydroperoxide intermediate and having the formula

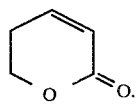

The identical product distribution is obtained when dihydropyran is photooxidized in methylene chloride was tetraphenylporphin, a known sensitizer for singlet oxygen photooxidation.

EXAMPLE 27

10.0 grams of chloromethylated styrene-divinylbenzene copolymer beads (1.38 meq. Cl/g) and 3.18 grams (14 meq.) of parabenzoyl benzoic acid were refluxed overnight with 70 ml of ethyl acetate and 2.0 ml of triethyl amine as a catalyst. The polymer beads were then filtered and carefully washed with various solvents to insure that all the free acid was removed from the polymer mattrix. The remaining copolymer possessed both an ester absorption (5.75 M) and a benzophenone absorption (6.01 M) in the infrared spectrum. The attached benzoyl benzoic acid could be quantitatively removed from the polymer support by transesterification with triethyl amine in methanol.

EXAMPLE 28

The polymer-bound benzoyl benzoic acid was used as a photosensitizing catalyst in the photodimerization of coumarin, as follows. To a solution of 5 mmoles of coumarin in 10 ml of benzene was added 1.4 meq of the polymer-bound benzoyl benzoic acid as prepared in Example 27 above. The resultant mixture contained in a pyrex vessel was irradiated with a 450 watt Hanovia medium pressure lamp for 72 hours. Removal of the photosensitizer beads by filtration of the reaction mixture through a sintered glass disc and removal of the solvent under vacuum yielded a dimer of coumarin having a melting point of 171–174 degrees C.

When the same procedure was followed, substituting 15 mmoles of a benzophenone photosensitizer for the polymer-bound benzoyl benzoic acid photosensitizer, an oily product was obtained from which the courmarin dimer could be isolated only after chromatography or repeated recrystallization.

EXAMPLE 29

The polymer-bound benzoyl benzoic acid was used as a photosensitizer in the photodimerization of indene, as follows. To a solution of 17.2 mmoles of indene in 15 ml of benzene was added one gram of the polymer-bound benzoyl benzoic acid prepared in accordance with Example 27. The resultant mixture contained in a pyrex vessel was irradiated with a 450 watt Hanovia medium pressure lamp at 25 degrees C. for 11 hours. Removal of the photosensitizer beads by filtration of the reaction mixture through a sintered glass disc and removal of the solvent under vacuum gave a 61 percent yield of indene dimer.

EXAMPLE 30

The polymer-bound benzoyl benzoic acid was used as a photosensitizing catalyst in the photocycloaddition of tetrachloroethylene to cyclopentadiene, as follows. To a mixture of 37.2 mmoles of tetrachloroethylene and 15.7 mmoles of cyclopentadiene was added the polymer-bound benzoyl benzoic acid prepared in accordance with Example 27. The resultant mixture contained in a pyrex vessel was irradiated with a 450 watt Hanovia medium pressure lamp at 10 degrees C. for 11 hours. Removal of the photosensitizer beads by filtration of the reaction mixture through a sintered glass disc resulted in a 3.5 percent yield of the cycloaddition product of the two reactants.

EXAMPLE 31

In this Example, the photooxidation procedure in which the polymer based rose bengals are used as photosensitizers is the same for each sensitizer. The following is the general photooxidation procedure using these polymer based rose bengals.

The photooxidations were carried out in a 2-cm round Pyrex tube equipped with a glass paddle which was driven from above by an attached, glass-enclosed, bar magnet. Oxygen was passed over the surface of the agitated solution during the irradiations. The light source for the experiments consisted of a 500-w tungsten halogen lamp (GE QJOOCL) with a UV-cutoff filter (Corning 3060: transmission 365 nm=0.5%). 2,3-diphenyl-p-dioxene (97 mg, 0.4 m mol) was dissolved in 10 ml of dry $CCl_4$ and added with 50 mg of the polymer-bound sensitizer to the irradiation vessel. The conversion of 2,3-diphenyl-p-dioxene to ethylene glycol dibenzoate was followed by thin layer chromatography with silica gel using $CH_2Cl_2$ elution. This reaction was taken as evidence for the formation of singlet molecular oxygen sensitized by the various insoluble, heterogeneous polymer sensitizers. Complete conversion required 2–4 hrs. irradiation.

Each of the polymer-rose bengal sensitizers prepared in Examples 13–21 were used in this photooxidation procedure and each gave similar good results.

EXAMPLE 32

Procedure for Preparation of Polymer-Rose Bengal

To 2.0 g of chloromethylated styrene-divinylbenzene copolymer beads, having 1.11 meq. Cl/g polymer in 60 ml of dimethylformamide was added 1.55 mmol of rose bengal. The mixture was stirred magnetically and heated at (60°) for 20 hr. The reaction mixture was then cooled to ambient temperature and filtered through a sintered glass funnel. The residue was washed thoroughly with 200 ml portions of solvent in the following order: ethyl acetate, ethanol, ethanol-water (1:1), water, methanol-water (1:1) and methanol. The polymer beads were then extracted with methanol or ethanol in a Soxlet extractor for at least 20 hr until no visible color appeared in the solvent. The polymer-rose bengal was then dried in a vacuum oven at 60° for 12 hr. The polymer beads used in this Example were of 200–400 microns mesh size the polymer cross-linked with 1.8 percent divinylbenzene and having a chloromethyl content of 0.65 meq. per gram.

Characterization of Polymer-Rose Bengal

The polymer-bound rose bengal prepared as described above, was analyzed by combustion for iodine content in order to determine the percent reaction of the chloromethyl groups with rose bengal. The data indicates that 16.5% of the chloromethyl groups had been converted to the rose bengal derivative. This polymer-rose bengal product was used in the photooxidations described hereinbelow in Example 32.

Cleavage of Polymer-Rose Bengal

To 10 ml of trifluoroacetic acid was added 200 mg of polymer-rose bengal (from polymer-$CH_2Cl$ containing 0.69 meq Cl/g-polymer). Anhydrous hydrogen bromide gas was bubbled into the reaction vessel for 45 min. at room temperature. The flask was stoppered and allowed to stand for 16 hrs. at room temperature. The polymer beads were then removed by filtration followed by washing three times with trifluoroacetic acid. The filtrate was evaporated under reduced pressure at 50°. The residue, a slightly yellow semi-solid, weighted 6.8 mg. Addition of a few drops of 5% sodium hydroxide solution gave a rose colored solution with a $\lambda_{max}$555 nm.[25] The weight of recovered rose bengal indicated incomplete cleavage from the polymer. The recovered polymer was then treated further with 250 mg of potassium hydroxide in 10 ml methanol with stirring at room temperature for 24 hrs. The mixture was filtered and washed with methanol. The total filtrate was transferred into a volumetric flask at diluted to 100 ml with methanol. The visible spectrum of the solution showed a maximum absorption at 555 nm (A=1.62 corresponding to 3.8 mg of free rose bengal). The total recovered rose bengal from the acidic and basic hydrolysis was 10.6 mg (0.0534 mmol/g polymer-rose bengal).

| Analysis of Polymer-Rose Bengal | | |
|---|---|---|
| Polymer—$CH_2Cl$ (meq/Cl/g polymer) | Combustion Analysis (a) % I | Attached Rose Bengal (mmol rose bengal g polymer |
| 1.11 | 9.36 | 0.183 |

(a) Average of duplicate analyses.

EXAMPLE 33

Photooxidation Procedure

The photooxidations described below were carried out in a 2 cm square Pyrex tube equipped with a glass paddle which was driven from above by an attached, glass enclosed, bar magnet. Oxygen was passed over the surface of the agitated solution during the irradiations. The light source for the preparative experiments consisted of a 500-W tungsten-halogen lamp (GE Q500Cl) with a uv-cutoff filter (Corning 3060: transmission 365 nm=0.5%).

Photooxidation of 2,3-diphenyl-p-dioxene with Polymer-Rose Bengal 2,3-diphenyl-p-dioxene (97.5 mg, 0.4 mmol) was dissolved in 10 ml of dry $CH_2Cl_2$ and added with 50 mg of polymer-rose bengal to the irradiation vessel. The conversion to ethylene glycol dibenzoate was followed by vpc (10 ft-20% Apiezon L at 250°). After 4 hr., the polymer-rose bengal was filtered from the solution and a uv-visible spectrum was recorded. The filtrate showed no absorption between 450 and 800 nm. The filtered $CH_2Cl_2$ solution (slightly yellow) was stripped of solvent and the oxidation product (mp 70°–71°, lit. 73°[25]) was isolated in 95% yield.

Photooxidation of 2,3-diphenyl-p-dioxene in the presence of 2,6-di-tert-butyl-p-cresol 2,3-diphenyl-p-dioxene (96.3 mg, 0.4 mmol) was dissolved in 10 ml of dry $CH_2Cl_2$. 2,6-di-tert-butyl-p-cresol (0.04 mmol) and polymer-rose bengal (50 mg) were added and the sample was irradiated for 4 hr. Vpc analysis of the reaction mixture indicated complete conversion to ethylene glycol dibenzoate in this time period.

Photooxidation of 2,3-diphenyl-p-dioxene in the presence of 1,4-diazabicyclo[2.2.2]octane 2,3-diphenyl-p-dioxene (97.3 mg, 0.4 mmol) was dissolved in 10 ml of dry $CH_2Cl_2$. (0.4 mmol) and 50 mg of polymer-rose bengal were added and the sample was irradiated for 4 hrs. VPC analysis of the reaction mixture indicated only 15% conversion to ethylene glycol dibenzoate.

Photooxidation of 2,3-diphenyl-p-dioxene with Rose Bengal in Suspension 2,3-diphenyl-p-dioxene (9.581 mg, 0.4 mmol) was dissolved in 10 ml of dry $CH_2Cl_2$ and 5 mg of rose bengal was added. The suspension obtained was intensely red. Irradiation of the suspension for 4 hr followed by filtration through a sintered glass filter afforded a colorless solution. Vpc analysis of the filtrate indicated only 4% conversion to ethylene glycol dibenzoate.

Photooxidation of 2,3-diphenyl-p-dioxene with Polymer-Rose Bengal Using Monochromatic Light 2,3-diphenyl-p-dioxene (51 mg, 0.21 mmol) was dissolved in 6 ml dry $CH_2Cl_2$ and 50 mg of polymer-rose bengal was added. The solution was irradiated at 565 nm with a Bausch and Lomb grating monochromator with an SP-200 mercury light source. Vpc analysis of the reaction mixture showed that the starting material was completely consumed in 2 hr. Examination of the uv-visible spectrum of the filtered reaction solution showed no absorptions in the 450–800 nm region.

Photooxidation of 1,2-dimethylcyclohexene with Polymer-Rose Bengal 1,2-dimethylcyclohexene (0.1191 g, 1.08 mmol) in 10 ml of $CH_2Cl_2$ and polymer-rose bengal (200 mg) was irradiated with the tungsten-halogen lamp for 4.5 hr. The resulting hydroperoxides were reduced with an excess of triphenylphosphine to the corresponding alcohols. Vpc analysis of the allylic alcohols was effected using a 10 ft −20% carbowax 20 M column at 130°. The yields of cyclohexenol products found are:

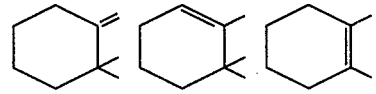

authentic samples of the alcohols I and II were obtained by photooxidation 1,2-dimethylcyclohexene with soluble sensitizer.

Photooxidation of Tetramethylethylene with Polymer-Rose Bengal

Tetramethylethylene (0.50 g, 6.0 mmol) in 10 ml of $CH_2Cl_2$ and polymer-rose bengal (100 mg) was irradiated under $O_2$ with the tungsten-halogen lamp. Vpc analysis showed the reaction to be complete after 10 hr. The polymer-rose bengal was filtered from the reaction solution and the $CH_2Cl_2$ was stripped off. Distillation of the residue under vacuum through a short path column (bp 58°/12 mm, lit.[26] bp 55°/12 mm) gave 82% of the allylic hydroperoxide.

Photooxidation of 1,3-cyclohexadiene with Polymer-Rose Bengal 1,3-cyclohexadiene (0.50 g, 6.3 mmol) in 10 ml of $CH_2Cl_2$ and 200 mg of polymer-rose bengal was irradiated for 9.5 hr with the tungsten-halogen lamp. The polymer-rose bengal was filtered off and the $CH_2Cl_2$ stripped from the crude product. The crude endoperoxide was distilled under vacuum (bp 84°/2 mm) and the resulting pale yellow oil was recrystallized from pentane to yield white crystals (mp 90°–91°, lit[27] mp 88.5°) in 69% yield.

Quantum Yield for Singlet Oxygen Formation with Polymer-Rose Bengal in $CH_2Cl_2$ The quantum yield for $^1O_2$ formation with polymer-rose bengal in $CH_2Cl_2$ was determined by comparing the rate of photooxidation of 2,3-diphenyl-p-dioxene with polymer-rose bengal in $CH_2Cl_2$ to the rate obtained with rose bengal dissolved in methanol. The quantum yield for $^1O_2$ formation with rose bengal in methanol is 0.76.[3c]

A solution of 2 (0.029 M) and rose bengal ($2.7 \times 10^{-4}$ M) in $CH_3OH$ was prepared. Irradiation of 6 ml of this solution in the square pyrex cell under $O_2$ with 562 nm light led to the formation of ethylene glycol dibenzoate. Under these conditions the rate of photooxidation of 2,3-diphenyl-p-dioxene was $3.05 \times 10^{-6}$ M sec$^{-1}$. In order to insure that all the incident radiation had been absorbed by the reaction solution, a second square pyrex cell containing 4 ml of the above solution of 2,3-diphenyl-p-dioxene and rose bengal was placed behind the reaction vessel. Vpc analysis indicated that no photooxidation occurred in the second cell.

The rate of photooxidation of 2,3-diphenyl-p-dioxene with polymer-rose bengal in $CH_2Cl_2$ was determined as above. A 6 ml solution of 2,3-diphenyl-p-dioxene (0.029 M) in $CH_2Cl_2$ with 200 mg of polymer-rose bengal was irradiated under $O_2$ with 562 nm light. Stirring was continued throughout the photooxidation. The progress of the reaction was monitored by vpc. The rate of photooxidation of 2,3-diphenyl-p-dioxene with polymer-rose bengal in $CH_2Cl_2$ under these conditions was $1.73 \times 10^{-6}$ M sec. Again to ensure that all of the incident radiation had been adsorbed by the reaction solution containing the heterogeneous sensitizer, a second cell with 4 ml of the methanolic solution of 2,3-diphenyl-p-dioxene and rose bengal was placed behind the reaction vessel. Vpc analysis showed no photooxidation in the second cell. Comparison of these zero-order rate of photooxidation gave a quantum yield for $^1O_2$ formation with polymer-rose bengal $CH_2Cl_2$ of 0.43.

What is claimed is:

1. A method of preparing a polymer-bound photosensitizing catalyst for use in heterogeneous catalysis of photosensitized chemical reactions, which comprises forming a mixture in an organic solvent of a polymeric material having attached thereto an available leaving group which is capable of being displaced in a nucleophilic displacement reaction with a nucleophilic reagent and a photosensitizing catalytic compound containing in its molecule a nucleophile which is capable of displacing the chloride atom of a chloromethatylated styrene polymer in a nucleophilic displacement reaction and which nucleophile is a photosensitizer dye selected from the group consisting of rose bengal, acridine orange, chlorophyllin, crystal violet, eosin Y, fluoroscein, flavin mononucleotide, hematoporphyrin, hemin, malachite green, methylene blue, rhodamine B, chlorophyll, cosine, erythrosin, methylene green, toluidine blue and thionine, refluxing said mixture for a time sufficient to effect a nucleophilic displacement reaction between said chloromethylated styrene polymer and said photosensitizing dye, and recovering from said mixture the resulting polymer-bound photosensitizing catalyst beads.

2. The method of claim 1 wherein said polymeric material is a chloromethylated styrene polymer.

3. The method of claim 2, wherein said chloromethylated styrene polymer is a chloromethylated styrenedivinylbenzene copolymer.

4. The method of claim 1 wherein said polymeric material is a cross-linked poly(2-hydroxymethyl)methacrylateethylene glycol copolymer.

5. The method of claim 1 wherein said polymeric material is a polyvinyl formal copolymer.

6. The method of claim 1 wherein said polymeric material is a styrene-maleic anhydride copolymer.

7. The method of claim 1 wherein said photosensitizer dye is rose bengal.

8. The method of claim 1 wherein said photosensitizing catalytic compound is a parabenzoyl benzoic acid.

* * * * *